(12) United States Patent
Li et al.

(10) Patent No.: US 12,514,072 B2
(45) Date of Patent: Dec. 30, 2025

(54) DISPLAY COMPRISING A STRESS RELEASING LAYER TO REDUCE FRACTURE OF CONDUCTIVE LAYERS

(71) Applicant: Shenzhen China Star Optoelectronics Semiconductor Display Technology Co., Ltd., Guangdong (CN)

(72) Inventors: Hua Li, Guangdong (CN); Baixiang Han, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 579 days.

(21) Appl. No.: 17/637,527

(22) PCT Filed: Jan. 24, 2022

(86) PCT No.: PCT/CN2022/073582
§ 371 (c)(1),
(2) Date: Feb. 23, 2022

(87) PCT Pub. No.: WO2023/133936
PCT Pub. Date: Jul. 20, 2023

(65) Prior Publication Data
US 2024/0057400 A1    Feb. 15, 2024

(30) Foreign Application Priority Data
Jan. 14, 2022 (CN) .......................... 202210040429.8

(51) Int. Cl.
*H10K 59/124* (2023.01)
*H10K 59/123* (2023.01)
(Continued)

(52) U.S. Cl.
CPC ......... *H10K 59/124* (2023.02); *H10K 59/123* (2023.02); *H10K 59/1315* (2023.02); *H01L 23/562* (2013.01)

(58) Field of Classification Search
CPC .. H10K 59/123; H10K 59/131; H10K 59/124; H10K 59/1315; H01L 23/562
See application file for complete search history.

(56) References Cited

U.S. PATENT DOCUMENTS 11,257,884 B2    2/2022    Lee et al.
2016/0260924 A1   9/2016    Lee et al.
(Continued)

FOREIGN PATENT DOCUMENTS

| CN | 109585514 | 4/2019 |
| CN | 111129125 | 5/2020 |

(Continued)

OTHER PUBLICATIONS

"Modulus of Elasticity—Young Modulus for some common materials", Mar. 21, 2016, URL: https://web.archive.org/web/20160321124105/https://www.bestech.com.au/wp-content/uploads/Modulus-of-Elasticity.pdf (Year: 2016).*
(Continued)

*Primary Examiner* — Christine S. Kim
*Assistant Examiner* — Tyler J Wiegand

(57) ABSTRACT

Provided is a display panel having a bending region, the display panel including a substrate, a stress releasing layer, and a conductive structure. A first stress releasing layer is disposed on the substrate, and corresponding to the bending region. The conductive structure is disposed on the substrate, and a Young's modulus of the conductive structure is greater than a Young's modulus of the first stress releasing layer.

20 Claims, 4 Drawing Sheets

(51) Int. Cl.
*H10K 59/131* (2023.01)
*H01L 23/00* (2006.01)

(56) References Cited

U.S. PATENT DOCUMENTS

2020/0312927 A1* 10/2020 Bae .................... H10D 30/6723
2021/0066423 A1* 3/2021 Lee ........................ H10K 59/40
2024/0096900 A1* 3/2024 Wang ........................ G09F 9/30
2024/0224620 A1* 7/2024 Shang ................ H10K 59/1201

FOREIGN PATENT DOCUMENTS

| CN | 111162193 | 5/2020 |
| CN | 111244111 | 6/2020 |
| CN | 112331681 | 2/2021 |
| CN | 112447795 | 3/2021 |
| CN | 112635530 | 4/2021 |
| CN | 114170908 | 3/2022 |

OTHER PUBLICATIONS

Notification of Office Action and Search Report Dated Mar. 22, 2025 From The State Intellectual Property Office of the People's Republic of China Re. Application No. 202210040429.8 and Its Translation Into English. (16 Pages).

* cited by examiner

DISPLAY COMPRISING A STRESS RELEASING LAYER TO REDUCE FRACTURE OF CONDUCTIVE LAYERS

RELATED APPLICATIONS

This application is a National Phase of PCT Patent Application No. PCT/CN2022/073582 having International filing date of Jan. 24, 2022, which claims the benefit of priority of Chinese Patent Application No. 202210040429.8 filed on Jan. 14, 2022. The contents of the above applications are all incorporated by reference as if fully set forth herein in their entirety.

FIELD AND BACKGROUND OF THE INVENTION

The present disclosure relates to a display technology field, and in particular to, a display panel.

Organic light emitting diodes (OLEDs) have characteristics such as self light-emission, high brightness, wide viewing angles, high contrast, flexibility, low energy consumption and the like, and thus are attracting much attention. As a new generation of display type, OLED displays have gradually replaced conventional liquid crystal displays (LCDs), and have been widely applied to mobile phone screens, computer displays, full-color televisions and the like. A flexible folded display panel may be rolled or bent while in use, and even be bent frequently. As more times the flexible folded display panel is bent, a wire resistance of a conductive structure is easily increased. As a result, defects such as a broken wire of a source/drain metal layer, may occur, which degrades display quality.

Therefore, it is necessary to provide a new technical concept to solve the above technical problems.

Embodiments of the present disclosure provide a display panel for improving a defect of the fracture of the conductive structure caused when a bending region of the display panel is bent.

An embodiment of the present disclosure provides a display panel, the display panel having a bending region and including:

a substrate;

a first stress releasing layer disposed on the substrate and corresponding to the bending region; and a conductive structure disposed on the substrate, wherein a Young's modulus of the conductive structure is greater than a Young's modulus of the first stress releasing layer, and an orthographic projection of the conductive structure on the substrate at least partially overlaps an orthographic projection of the first stress releasing layer on the substrate.

In the display panel according to an embodiment of the present disclosure, the conductive structure includes a first conductive structure, the first conductive structure is a single layer structure, and the first conductive structure is disposed on at least one surface of the first stress releasing layer.

In the display panel according to an embodiment of the present disclosure, the display panel further includes:

a buffer layer disposed on the substrate;

a first semiconductor layer disposed on a surface of the buffer layer away from the substrate;

a gate insulating layer disposed on a surface of the first semiconductor layer away from the buffer layer;

a first gate disposed on a surface of the gate insulating layer away from the first semiconductor layer; and an interlayer dielectric layer covering the first gate, the first semiconductor layer and the buffer layer, wherein the first stress releasing layer is disposed on a surface of the interlayer dielectric layer away from the first gate, and the first conductive structure is disposed on a surface of the first stress releasing layer away from the interlayer dielectric layer, and wherein a Young's modulus of the interlayer dielectric layer is greater than the Young's modulus of the first stress releasing layer.

In the display panel according to an embodiment of the present disclosure, the first conductive structure is further disposed on a surface of the first stress releasing layer near the interlayer dielectric layer.

In the display panel according to an embodiment of the present disclosure, the first conductive structure includes a first source and a first drain, and the first stress releasing layer includes a plurality of first stress releasing blocks disposed apart from each other, and the first source and the first drain each covers corresponding one of the first stress releasing blocks; and wherein the interlayer dielectric layer includes a first via hole and a second via hole each penetrating through the interlayer dielectric layer, and the first source and the first drain are electrically connected to the first semiconductor layer through the first via hole and the second via hole, respectively.

In the display panel according to an embodiment of the present disclosure, the cross-sectional shape of the first stress releasing block includes at least one of a trapezoidal shape, a rectangular shape, a square shape, a circle shape, a rhombic shape, a triangle shape, or an irregularly-shaped hole.

In the display panel according to an embodiment of the present disclosure, the first stress releasing layer further covers at least one surface of the first conductive structure.

In the display panel according to an embodiment of the present disclosure, the conductive structure includes a first conductive structure, the first conductive structure includes a first conductive layer and a second conductive layer, the first conductive layer is disposed on a surface of the first stress releasing layer near the substrate, the second conductive layer is disposed on a surface of the first stress releasing layer away from the substrate, the first stress releasing layer includes a plurality of contact holes, and the first conductive layer and the second conductive layer are electrically connected through the contact holes.

In the display panel according to an embodiment of the present disclosure, the display panel further includes:

a buffer layer disposed on the substrate;

a first semiconductor layer disposed on a surface of the buffer layer away from the substrate;

a gate insulating layer disposed on a surface of the first semiconductor layer away from the buffer layer;

a first gate disposed on a surface of the gate insulating layer away from the first semiconductor layer; and an interlayer dielectric layer covering the first gate, the first semiconductor layer and the buffer layer, wherein the first stress releasing layer is disposed on a surface of the interlayer dielectric layer away from the first gate, the first conductive layer is disposed on a surface of the first stress releasing layer near the interlayer dielectric layer, and the second conductive layer is disposed on a surface of the first stress releasing layer away from the interlayer dielectric layer, and wherein a Young's modulus of the interlayer dielectric layer is greater than a Young's modulus of the first stress releasing layer.

In the display panel according to an embodiment of the present disclosure, the first conductive layer includes a first portion of a first source and a first portion of a first drain, the second conductive layer includes a second portion of the first source and a second portion of the first drain, the first portion of the first source and the second portion of the first source are electrically connected through at least one of the contact holes, and the first portion of the first drain and the second portion of the first drain are electrically connected through at least one of the contact holes; and wherein the interlayer dielectric layer includes a first via hole and a second via hole each penetrating through the interlayer dielectric layer, and the first portion of the first source and the first portion of the first drain are electrically connected to the first semiconductor layer through the first via hole and the second via hole, respectively.

In the display panel according to an embodiment of the present disclosure, the conductive structure further includes a second conductive structure disposed on the substrate, wherein the second conductive structure includes a first light shielding layer located in the bending region; and wherein the interlayer dielectric layer further includes a third via hole penetrating through the interlayer dielectric layer and the buffer layer, and the first drain is electrically connected to the first light shielding layer through the third via hole.

In the display panel according to an embodiment of the present disclosure, the second conductive structure further includes a first plate, the first conductive structure further includes a second plate, the first plate and the second plate constitute a first storage capacitor, the first storage capacitor is located in the bending region, the second plate is disposed on the surface of the first stress releasing layer away from the interlayer dielectric layer, and an orthographic projection of the first plate on the substrate covers an orthographic projection of the second plate on the substrate.

In the display panel according to an embodiment of the present disclosure, the first storage capacitor further includes a third plate disposed in a same layer as the first semiconductor layer, and the orthographic projection of the first plate on the substrate covers an orthographic projection of the third plate on the substrate; and wherein the second plate and the first plate are electrically connected.

In the display panel provided in an embodiment of the present disclosure, the display panel further includes a second stress releasing layer disposed on a surface of the second conductive structure near the substrate, and a Young's modulus of the second stress releasing layer is smaller than a Young's modulus of the second conductive structure and a Young's modulus of the substrate.

In the display panel provided in an embodiment of the present disclosure, the second stress releasing layer includes a second stress releasing block disposed corresponding to the first light shielding layer.

In the display panel provided in an embodiment of the present disclosure, the second conductive structure further includes a first metal wiring, the first conductive structure further includes a second metal wiring, the first metal wiring and the second metal wiring are electrically connected, and the first metal wiring and the second metal wiring constitute a same power supply wiring.

In the display panel provided in an embodiment of the present disclosure, the first conductive structure further includes a second source and a second drain, the second conductive structure further includes a second light shielding layer, and the display panel further includes a flat display region located at both surfaces of the bending region, wherein the second light shielding layer, the second source and the second drain are located in the flat display region, and the second source and the second drain are disposed on the interlayer dielectric layer, and wherein the display panel further includes:

a second semiconductor layer disposed in a same layer as the first semiconductor layer, wherein the second source and the second drain are electrically connected to the second semiconductor layer, respectively; and a second gate disposed in a same layer as the first gate.

In the display panel provided in an embodiment of the present disclosure, the second conductive structure further includes a fourth plate, the first conductive structure further includes a fifth plate, the fourth plate and the fifth plate constitute a second storage capacitor corresponding to the flat display region, and an orthographic projection of the fourth plate on the substrate covers an orthographic projection of the fifth plate on the substrate.

In the display panel provided in an embodiment of the present disclosure, the second storage capacitor further includes a sixth plate disposed in a same layer as the second semiconductor layer, the orthographic projection of the fourth plate on the substrate covers an orthographic projection of the sixth plate on the substrate, and the fifth plate and the fourth plate are electrically connected.

In the display panel provided in an embodiment of the present disclosure, the display panel further includes:

a passivation layer covering the interlayer dielectric layer and the first conductive structure;

a planarization layer disposed on a surface of the passivation layer away from the interlayer dielectric layer;

an anode disposed on a surface of the planarization layer away from the passivation layer and electrically connected to the first conductive structure;

a pixel definition layer disposed on a surface of the anode is further from the planarization layer, the pixel definition layer including an opening that exposes a portion of the anode;

a light emitting layer limited to within the opening; and a cathode covering the light emitting layer and the pixel definition layer.

Beneficial Effects

An embodiment of the present disclosure provides a display panel having a bending region, the display panel including a substrate, a first stress releasing layer, and a conductive structure. The first stress releasing layer is disposed on the substrate and corresponds to the bending region. The conductive structure is disposed on the substrate, and a Young's modulus of the conductive structure is greater than a Young's modulus of the first stress releasing layer. An orthographic projection of the conductive structure on the substrate at least partially overlaps an orthographic projection of the first stress releasing layer on the substrate. In an embodiment of the present disclosure, by providing the first stress releasing layer in the bending region, a defect of the fracture of the conductive structure caused when the bending region of the display panel is bent is improved, because the orthographic projection of the conductive structure on the substrate at least partially overlaps the orthographic projection of the first stress releasing layer on the substrate and a Young's modulus of the conductive structure is greater than a Young's modulus of the first stress releasing layer.

BRIEF DESCRIPTION OF THE SEVERAL VIEWS OF THE DRAWINGS

In order to more clearly illustrate the technical solutions in embodiments of the present disclosure, the accompanying drawings depicted in the description of the embodiments will be briefly described below. It will be apparent that the accompanying drawings in the following description are merely some embodiments of the present disclosure, and other drawings may be obtained from these drawings without creative effort by those skilled in the art.

DESCRIPTION OF SPECIFIC EMBODIMENTS OF THE INVENTION

Figure 1:
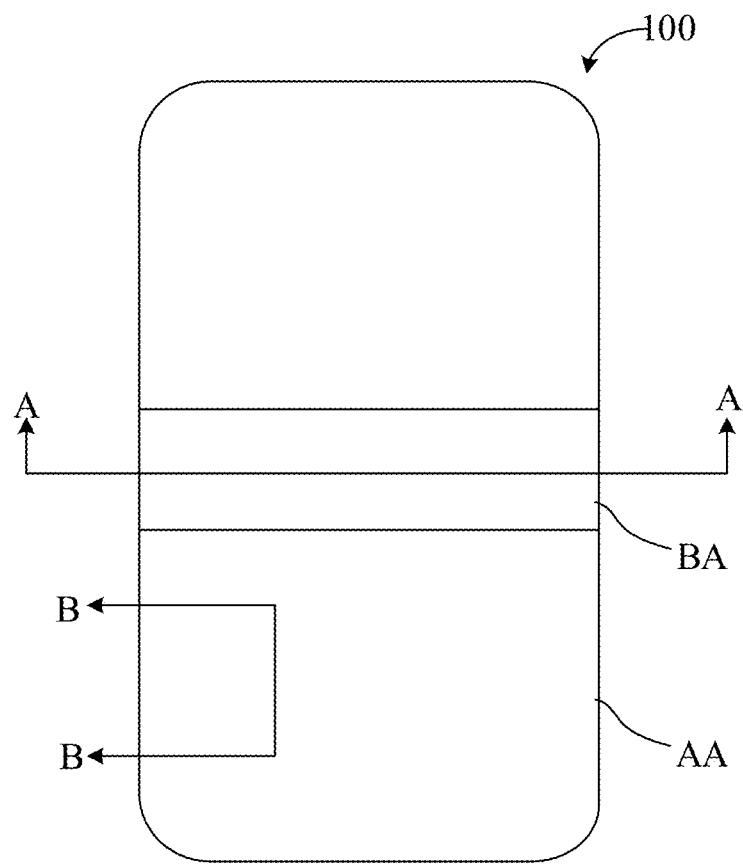
FIG. 1 is a schematic plan view of a display panel according to an embodiment of the present disclosure.

In order to make the purpose, technical solutions and advantages of the present disclosure clearer, the present disclosure will be further described in detail below in conjunction with the accompanying drawings. In conjunction with figures in the accompanying drawings in which the same reference symbols represent the same components, the following descriptions are based on the shown specific embodiments of the present disclosure, and thus should not be construed as limiting other specific embodiments of the present disclosure not described in detail herein. As used in the present specification, the word "embodiment" means an instance, instance, or illustration.

In the description of the present disclosure, it should be understood that orientations or position relationships indicated by the terms "center", "longitudinal", "lateral", "length", "width", "thickness", "upper", "lower", "front", "rear", "left", "right", "vertical", "horizontal", "top", "bottom", "inside", "outside", "clockwise", and "counter-clockwise" are based on orientations or position relationships illustrated in the drawings. The terms are used to facilitate and simplify the description of the present disclosure, rather than indicate or imply that the devices or elements referred to herein are required to have specific orientations or be constructed or operate in the specific orientations. Accordingly, the terms should not be construed as limiting the present disclosure. In addition, the term "first", "second" are for illustrative purposes only and are not to be construed as indicating or imposing a relative importance or implicitly indicating the number of technical features indicated. Thus, a feature that limited by "first", "second" may expressly or implicitly include one or more of the features. In the description of the present disclosure, the meaning of "plural" is two or more, unless otherwise specifically defined.

Embodiments of the present disclosure provide a display panel. Each of them will be described in detail below. It should be noted that the description order of the following embodiments is not intended to limit the preferred order of the embodiments.

An embodiment of the present disclosure provides a display panel having a bending region, the display panel including a substrate, a first stress releasing layer, and a conductive structure. The first stress releasing layer is disposed on the substrate and corresponds to the bending region. The conductive structure is disposed on the substrate, and a Young's modulus of the conductive structure is greater than a Young's modulus of the stress releasing layer. An orthographic projection of the conductive structure on the substrate at least partially overlaps an orthographic projection of the first stress releasing layer on the substrate. In an embodiment of the present disclosure, by providing the first stress releasing layer in the bending region, a defect of the fracture of the conductive structure caused when the bending region of the display panel is bent is improved, because the orthographic projection of the conductive structure on the substrate at least partially overlaps the orthographic projection of the first stress releasing layer on the substrate and a Young's modulus of the conductive structure is greater than the Young's modulus of the first stress releasing layer. A display panel according to the present disclosure will be described in detail below by particular embodiments.

Figure 2:
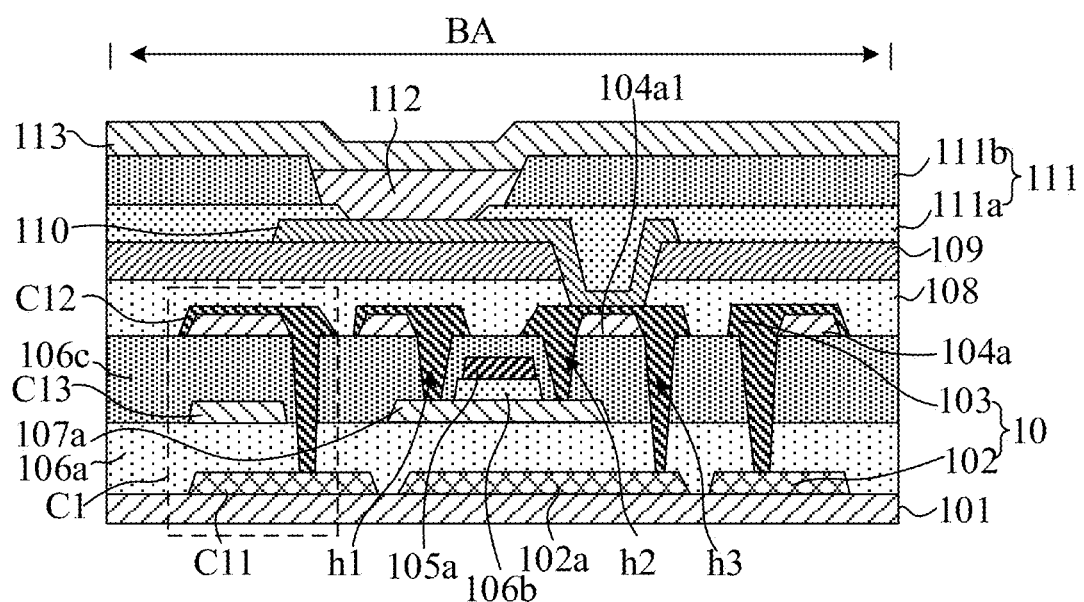
FIG. 2 is a schematic diagram of a first cross-sectional structure taken along line A-A of a display panel according to an embodiment of the present invention.
Figure 3:
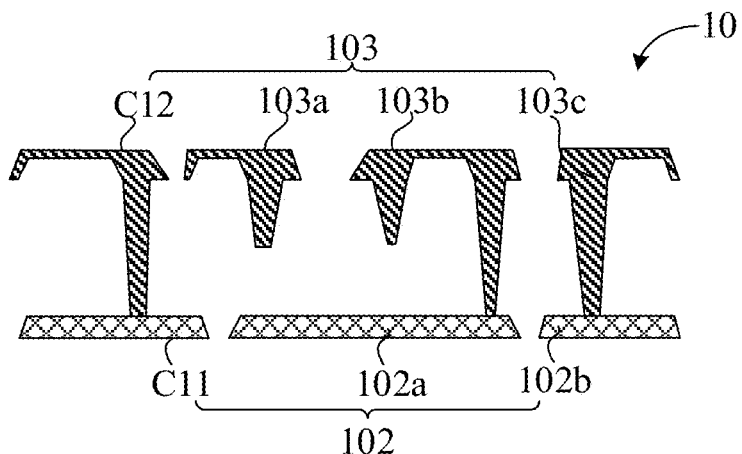
FIG. 3 is a schematic view of a conductive structure of FIG. 2.
Figure 4:
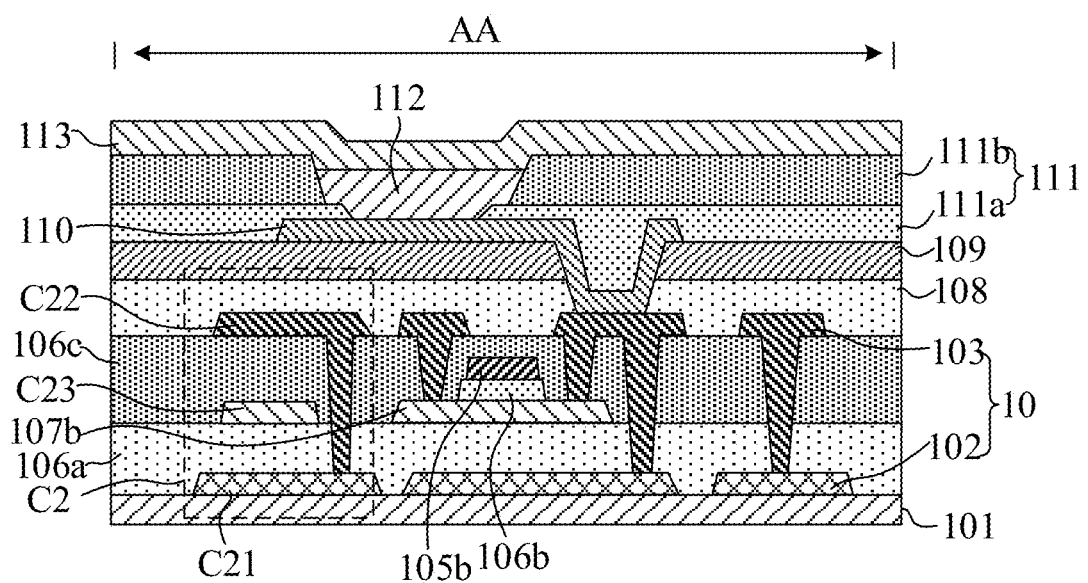
FIG. 4 is a schematic cross-sectional view taken along line B-B of a display panel according to an embodiment of the present invention.
Figure 5:
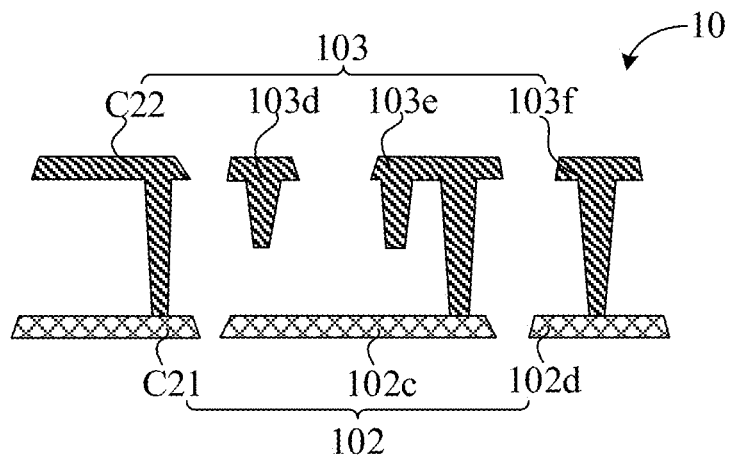
FIG. 5 is a schematic view of a conductive structure of FIG. 4.

Referring to FIGS. 1, 2, 3, 4, and 5, FIG. 1 is a schematic plan view of the display panel according to an embodiment of the present disclosure. FIG. 2 are schematic diagrams of a first cross-sectional structure taken along line A-A of the display panel according to an embodiment of the present invention. FIG. 3 is a schematic view of a conductive structure of FIG. 2. FIG. 4 is a schematic cross-sectional view taken along line B-B of FIG. 1. FIG. 5 is a schematic view of the conductive structure in FIG. 4. An embodiment of the present disclosure provides the display panel 100 having a bending region BA and a flat display region AA located on at least one surface of the bending region BA. The display panel 100 includes a substrate 101, a first stress releasing layer 104a, and the conductive structure 10. The first stress releasing layer 104a is disposed on the substrate 101 and corresponds to the bending region BA. The conductive structure is disposed on the substrate 101, a Young's modulus of the conductive structure 10 is greater than a Young's modulus of the first stress releasing layer 104a, and an orthographic projection of the conductive structure 10 on the substrate 101 at least partially overlaps an orthographic projection of the first stress releasing layer 104a on the substrate 101. In an embodiment of the present disclosure, by providing the first stress releasing layer 104a in the bending region BA, a defect of the fracture of the conductive structure caused when the bending region BA of the display panel 100 is bent is improved, because the orthographic projection of the conductive structure 10 on the substrate 101 at least partially overlaps the orthographic projection of the first stress releasing layer 104a on the substrate 101 and the Young's modulus of the conductive structure 10 is greater than the Young's modulus of the first stress releasing layer 104a.

It should be noted that the bending region BA in an embodiment of the present disclosure may be a bending display region having a display function. In addition, the bending region BA may be an additional region for arranging wirings so as to drive the display panel 100 to display the image. The embodiment of the present disclosure is described by taking the bending region as a bending display region as an example, but is not limited to this.

In an embodiment of the present disclosure, the conductive structure 10 includes a first conductive structure 103, the first conductive structure is a single layer structure, and the first conductive structure 103 is disposed on a surface of the first stress releasing layer 104a away from the substrate 101.

In some embodiments, the first conductive structure 103 is disposed on a surface of the first stress releasing layer 104a near the substrate 101.

Alternatively, in some embodiments, the first conductive structure 103 is disposed on the surface of the first stress releasing layer 104a away from the substrate 101 and on the surface of the first stress releasing layer 104a near the substrate 101.

In an embodiment of the present disclosure, as shown in FIGS. 2 and 4, the display panel 100 further includes a buffer layer 106a, a first semiconductor layer 107a, a second semiconductor layer 107b, a gate insulating layer 106b, a first gate 105a, a second gate 105b, and an interlayer dielectric layer 106c. The buffer layer 106a is disposed on the substrate 101. The first semiconductor layer 107a is disposed on a surface of the buffer layer 106a away from the substrate 101. The first semiconductor layer 107a is located in the bending region. The second semiconductor layer 107b is disposed in the same layer as the first semiconductor layer 107a, and the second semiconductor layer 107b is located in the flat display region AA. The gate insulating layer 106b is disposed on a surface of the first semiconductor layer 107a away from the buffer layer 106a. The first gate 105a is disposed on a surface of the gate insulating layer 106b away from the first semiconductor layer 107a. The second gate 105b is disposed in the same layer as the first gate 105a. The first gate 105a is located in the bending region BA, and the second gate 105b is located in the flat display region AA. The interlayer dielectric layer 106c covers the first gate 105a, the first semiconductor layer 107a, and the buffer layer 106a. The first stress releasing layer 104a is disposed on a surface of the interlayer dielectric layer 106c away from the first gate 105a, and the first conductive structure 103 is disposed on a surface of the first stress releasing layer 104a away from the interlayer dielectric layer 106c. A Young's modulus of the interlayer dielectric layer 106c is greater than the Young's modulus of the first stress releasing layer 104a. In an embodiment of the present disclosure, since the first conductive structure 103 is disposed on the surface of the first stress releasing layer 104a away from the interlayer dielectric layer 106c, and the Young's modulus of the interlayer dielectric layer 106c is greater than the Young's modulus of the first stress releasing layer 104a, the first stress releasing layer 104a disperses a stress formed in the first conductive structure 103 onto the first stress releasing layer 104a, thereby improving a defect of the fracture of the conductive structure caused when the bending region BA of the display panel 100 is bent.

Alternatively, in some embodiments, the first conductive structure 103 is disposed on a surface of the first stress releasing layer 104a near the interlayer dielectric layer 106c. Since the first conductive structure 103 is disposed on a surface of the first stress releasing layer 104a near the interlayer dielectric layer 106c, and the Young's modulus of the interlayer dielectric layer 106c is greater than the Young's modulus of the first stress releasing layer 104a, the first stress releasing layer 104a disperses the stress formed in the first conductive structure 103 onto the first stress releasing layer 104a, thereby improving a defect of the fracture of the conductive structure caused when the bending region BA of the display panel 100 is bent.

Alternatively, in some embodiments, the first stress releasing layer 104a covers at least one surface of the first conductive structure 103. In particular, in one embodiment, the first stress releasing layer 104a covers one surface of the first conductive structure 103. In another embodiment, the first stress releasing layer 104a covers both surfaces of the first conductive structure 103. In embodiments of the present disclosure, the first stress releasing layer 104a covers at least one surface of the first conductive structure 103. Thus, the first stress releasing layer 104a disperses the stress formed in the first conductive structure 103 onto the first stress releasing layer 104a, thereby further improving a defect of the fracture of the conductive structure caused when the bending region BA of the display panel 100 is bent.

In some embodiments, a material of the first stress releasing layer 104a may be an organic flexible material, including at least one of polyimide (PI), polyethylene terephthalate (PET), polyethylene naphthalate (PEN), polycarbonate (PC), polyethersulfone (PES), aromatic fluorotoluene containing polyarylate (PAR) or polycyclic olefin (PCO).

Alternatively, in some embodiments, the first conductive structure 103 may also be disposed on the surfaces of the first stress releasing layer 104a near and further from the interlayer dielectric layer 106c. That is, the surface of the first conductive structure 103 away from the interlayer dielectric layer 106c and the surface of the second conductive structure layer 103 near the interlayer dielectric layer 106c both are provided with the first stress releasing layer 104a, and the Young's modulus of the interlayer dielectric layer 106c is greater than the Young's modulus of the first stress releasing layer 104a. Therefore, the first stress releasing layer 104a disperses the stress formed in the first conductive structure 103, onto the first stress releasing layer 104a located on upper and lower surfaces of the first conductive structure 103, thereby improving a defect of the fracture of the conductive structure caused when the bending region BA of the display panel 100 is bent.

Further, the first conductive structure 103 includes a first source 103a, a first drain 103b, a second source 103d, and a second drain 103e. The second conductive structure 102 includes a first light shielding layer 102a and a second light shielding layer 102c. The first source 103a, the first drain 103b, and the first light shielding layer 102a are located in the bending region. The second source 103d, the second drain 103e, and the second light shielding layer 102c are located in the flat display region. The first stress releasing layer 104a includes a plurality of first stress releasing blocks 104a1 disposed at intervals. The first source 103a and the first drain 103b each covers corresponding one of the first stress releasing blocks 104a1. The interlayer dielectric layer 106c includes a first via hole h1, a second via hole h2, and a third via hole h3. The first via hole h1 and the second via hole h2 each penetrates through the interlayer dielectric layer 106c. The third via hole h3 penetrates through the interlayer dielectric layer 106c and the buffer layer 106a. The first source 103a and the first drain 103b are electrically connected to the first semiconductor layer 107a through the first via hole h1 and the second via hole h2, respectively. The first drain 103b is electrically connected to the first light shielding layer 102a through the third via hole h3. The second source 103d and the second drain 103e are disposed on the interlayer dielectric layer 106c. The second source 103d and the second drain 103e are electrically connected to the second semiconductor layer 107b, respectively. In an embodiment of the present disclosure, one surface of the first source 103a near the interlayer dielectric layer 106c and one surface of the first drain 103b near the interlayer dielectric layer 106c each is provided with a first stress releasing block 104a1, and the first stress releasing block 104a1 corresponds to the first source 103a and the first drain 103b one-to-one. Therefore, the first stress releasing block 104a1 disperses the stresses formed in the first source 103a and the first drain 103b onto the first stress releasing block 104a1, thereby improving a risk of fracture of the bending region BA caused to when the source/drain metal layer is bent, and further improving the issue of fracture of the conductive structure caused when the bending region BA of the display panel 100 is bent. Further, since the first light shielding layer 102a is electrically connected to the first drain 103b, the first light shielding layer 102a can be used not only for shielding the first semiconductor layer 107a from light, but also for preventing light from affecting stability of the first semiconductor layer 107a. Further, the first light shielding layer 102a and the first drain 103b are electrically connected to each other, and parasitic capacitance is formed between the first light shielding layer 102a and the first semiconductor layer 107a and the first gate 105a because the first light shielding layer 102a respectively overlap the first semiconductor layer 107a and the first gate 105a. When the display panel is operated, a voltage supplied to the first drain 103b changes with a voltage supplied to the data signal line, so that a voltage supplied to the first light shielding layer 102a changes, thereby affecting the electrical performance of the first semiconductor layer 107a. By connecting the first light shielding layer 102a and the first drain 103b to form an equipotential, it is possible to avoid a change of the voltage supplied to the first light shielding layer 102a from affecting the electrical performance of the first semiconductor layer 107a. In addition, in embodiments of the present disclosure, the conductive structure 10 corresponding to the flat display region AA does not need to be bent. Therefore, the stress formed in the conductive structure 104 does not need to be dispersed by using the first or second stress releasing layers 104a or 104b, thereby simplifying the process of manufacturing of the display panel 100.

In some embodiments, the cross-sectional shape of the first stress releasing block 104a1 includes shapes such as trapezoidal, rectangular, square, circular, rhombic, and triangular shapes, etc., or shapes such as irregularly-shaped holes, etc. When the first stress releasing block 104a1 has a trapezoidal, rectangular, square, circular, rhombic, or triangular cross-sectional shape, the stress can be favorably dispersed.

Alternatively, in some embodiments, the second conductive structure 102 further includes a first plate C11, and the first conductive structure 103 further includes a second plate C12. The first plate C11 and the second plate C12 constitute a first storage capacitor C1. The second plate C12 is disposed on the surface of the first stress releasing layer 104a away from the interlayer dielectric layer 106c. An orthographic projection of the first plate C11 on the substrate 101 covers an orthographic projection of the second plate C12 on the substrate 101. In an embodiment of the present disclosure, by providing the first stress releasing layer 104a on a surface of the second plate C12 near the interlayer dielectric layer 106c, the risk of fracture of the first storage capacitor C1 caused when the bending region BA is bent is improved, and a defect of the fracture of the conductive structure caused when the bending region of the display panel is bent is further improved.

Alternatively, in some embodiments, the first storage capacitor C1 further includes a third plate C13. The third plate C13 is disposed in the same layer as the first semiconductor layer 107a. The orthographic projection of the first plate C11 on the substrate 101 covers an orthographic projection of the third plate C13 on the substrate 101. The second plate C12 and the first plate C11 are electrically connected. In an embodiment of the present disclosure, the first storage capacitor C1 is arranged in a sandwich structure, that is, the first and third plates C11 and C13 can be regarded as a first sub-storage capacitor, and the second and third plates C12 and C13 can be regarded as a second sub-storage capacitor. The first sub-storage capacitor and the second sub-storage capacitor are connected in parallel, which increases the charge storage capacity of the capacitor. In addition, since the third plate C13 is provided in the same layer as the first semiconductor layer 107a, the third plate C13 can be formed in the same process as the first semiconductor layer 107a. Therefore, there is no need to additionally add a photomask, and the manufacturing process of the display panel 100 is simplified. It should be understood that the third plate C13 is formed by conducting a semiconductor material.

Alternatively, in some embodiments, the second conductive structure 102 further includes a first metal wiring 102b. The first conductive structure 103 further includes a second metal wiring 103c. The first metal wiring 102b and the second metal wiring 103c are electrically connected. In an embodiment of the present disclosure, the first metal wiring 102b and the second metal wiring 103c may constitute a same power supply wiring, which may be a high-voltage power supply wiring, a low-voltage power supply wiring, another conductive line, or the like. In an embodiment is of the present disclosure, the first metal wiring 102b and the second metal wiring 103c may constitute a same power supply wirings that are electrically connected through via holes, and a stress formed by the metal wirings may be dispersed to different film layers, thereby preventing the risk of fracture of the metal wirings caused when the metal wirings are bent. In addition, the first stress releasing block 104a1 is correspondingly disposed on a surface of the second metal wirings 103c near the interlayer dielectric layer 106c, to further prevent the risk of fracture caused when the second metal wirings 103c are bent.

Figure 6:
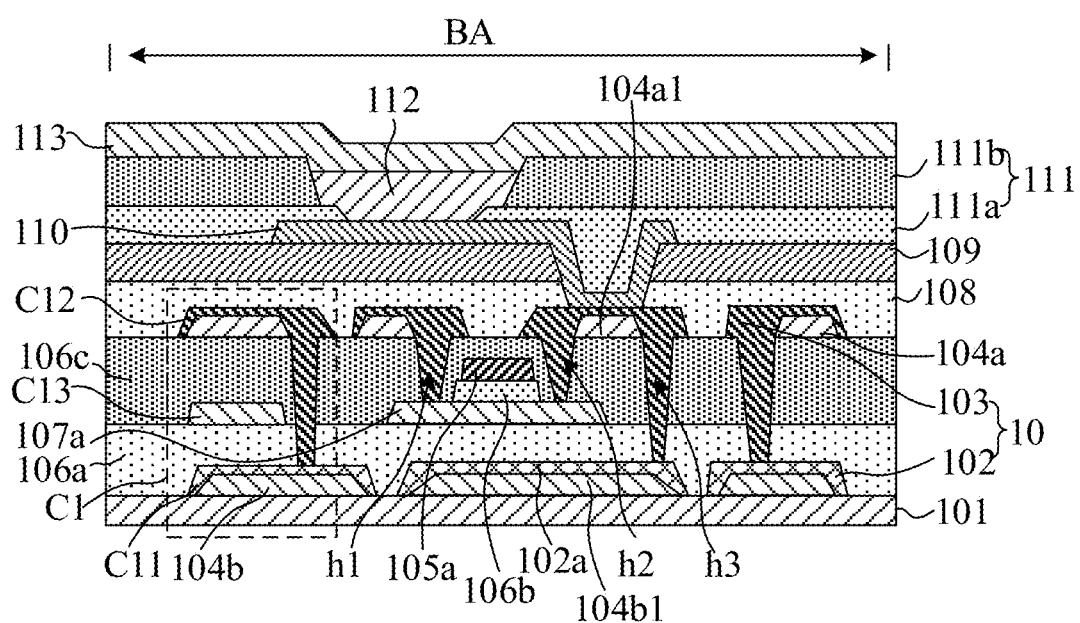
FIG. 6 is a second schematic cross-sectional view taken along line A-A of the display panel according to an embodiment of the present invention.

In conjunction with FIGS. 1 and 5, FIG. 6 is a schematic cross-sectional view taken along line A-A of the display panel according to an embodiment of the present invention. The display panel 100 according to an embodiment of the present disclosure differs from FIG. 2 in that the display panel 100 further includes a second stress releasing layer 104b. The second stress releasing layer 104b is located in the bending region BA. The second stress releasing layer 104b includes a second stress releasing block 104b1, and the second stress releasing block 104b1 is disposed corresponding to the first light shielding layer 102a. A second stress releasing block 104b1 is disposed on a surface of the second conductive structure 102 near the substrate 101. The Young's modulus of the second stress releasing layer 104b is smaller than a Young's modulus of the second conductive structure 102 and a Young's modulus of the substrate 101. In an embodiment of the present disclosure, the second stress releasing layer 104b is provided on the surface of the second conductive structure 102 near the substrate 101. The Young's modulus of the second stress releasing layer 104b is smaller than the Young's modulus of the second conductive structure 102 and the Young's modulus of the substrate 101. Therefore, a risk of the fracture of the second conductive structure 102 caused when the bending region BA is bent is improved, and the issue of the fracture of the conductive structure caused when the bending region BA of the display panel 100 is bent is further improved.

Alternatively, in an embodiment, the second stress releasing block 104b1 may further be disposed on a surface of the second conductive structure 102 away is from the substrate 101.

In some embodiments, the cross-sectional shape of the second stress releasing block 104b1 includes shapes such as trapezoidal, rectangular, square, circular, rhombic, and triangular shapes, etc., or shapes such as irregularly-shaped holes, etc. When the second stress releasing block 104b1 has a trapezoidal, rectangular, square, circular, rhombic, or triangular cross-sectional shape, the stress can be favorably dispersed.

Figure 7:
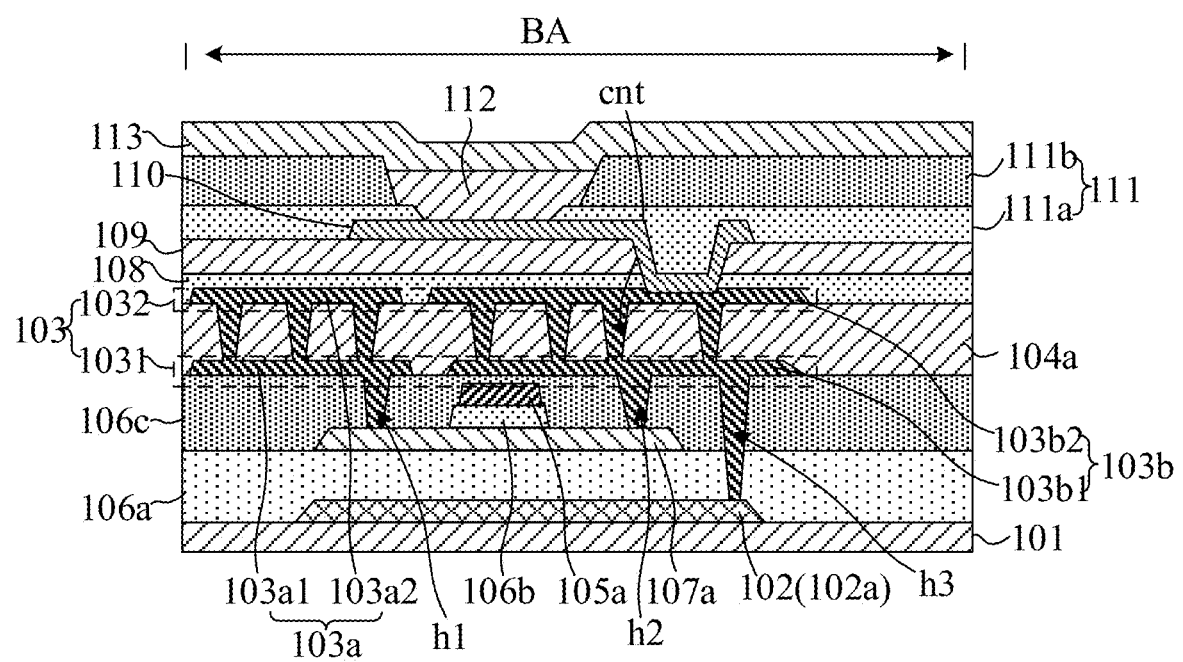
FIG. 7 is a third schematic cross-sectional view taken along line A-A of the display panel according to an embodiment of the present invention.

Referring to FIGS. 1 and 7, FIG. 7 is a schematic cross-sectional view taken along line A-A of the display panel according to an embodiment of the present invention. The display panel 100 according to an embodiment of the present disclosure differs from FIG. 2 in that the first conductive structure 103 includes a first conductive layer 1031 and a second conductive layer 1032. The first conductive layer 1031 is disposed on a surface of the first stress releasing layer 104a near the substrate 101. A second conductive layer 1032 is disposed on a surface of the first stress releasing layer 104a away from the substrate 101. The first stress releasing layer 104a includes a plurality of contact holes cnt. The first conductive layer 1031 and the second conductive layer 1032 are electrically connected through the contact hole cnt.

Alternatively, in some embodiments, the first conductive layer 1031 is disposed on the surface of the first stress releasing layer 104a near the interlayer dielectric layer 106c. The second conductive layer 1032 is disposed on the surface of the first stress releasing layer 104a away from the interlayer dielectric layer 106c. In an embodiment of the present disclosure, the first conductive structure 103 is disposed as a multi-layered structure, so that the stress formed in the first conductive structure 103 is dispersed to different film layers. In addition, the first stress releasing layer 104a is disposed between the first conductive layer 103 land the second conductive layer 1032, and the stress formed in the first conductive layer 1031 and the second conductive layer 1032 may be dispersed onto the first stress releasing layer 104a, thereby improving the risk of the fracture of the first conductive structure 103 caused when the bending region BA is bent, thereby improving a defect of the fracture of the is conductive structure caused when the bending region BA of the display panel 100 is bent.

In some embodiments, the first stress releasing layer 104a between any adjacent two contact holes cnt is defined as a first stress releasing block having a cross-sectional shape including shapes such as trapezoidal, rectangular, square, circular, rhombic, and triangular shapes, etc., or shapes such as irregularly-shaped holes, etc. When the first stress releasing block 104a1 has a trapezoidal, rectangular, square, circular, rhombic, or triangular cross-sectional shape, the stress can be favorably dispersed.

In some embodiments, the number of contact holes cnt is greater than or equal to one. For example, the number of the contact holes cnt may be any one of one, two, three, four, five or eight. When the first conductive layer 1031 and the second conductive layer 1032 are electrically connected through at least one of the contact holes cnt, to prevent display deterioration of the display panel due to the poor contact in a wiring in any one of the contact holes cnt.

Alternatively, in some embodiments, the first conductive layer 1031 includes a first portion 103a1 of the first source 103a and a first portion 103b1 of the first drain 103b. The second conductive layer 1032 includes a second portion 103a2 of the first source 103a and a second portion 103b2 of the first drain 103b. The first portion 103a1 of the first source 103a and the second portion 103a2 of the first source 103a are electrically connected through at least one of the contact holes cnt, and the first portion 103a1 of the first source 103a and the second portion 103a2 of the first source 103a are located in the bending region BA. The first portion 103b1 of the first drain 103b and the second portion 103b2 of the first drain 103b are electrically connected through at least one of the contact holes cnt, and the first portion 103b1 of the first drain 103b and the second portion 103b2 of the first drain 103b are located in the bending region BA. The interlayer dielectric layer 106c includes the first via hole h1, the second via hole h2, and the third via hole h3. The first via hole h1 and the second via hole h2 penetrate through the interlayer dielectric layer 106c. The third via hole h3 penetrates through the interlayer dielectric layer 106c and the buffer layer 106a. The first portion 103a1 of the first source 103a and the first portion 103b1 of the first drain 103b are electrically connected to the first semiconductor layer 107a through the first via hole h1 and the second via hole h2, respectively. The first drain 103b is electrically connected to the first light shielding layer 102a through the third via hole h3. In an embodiment of the present disclosure, the first source 103a and the first drain 103b each is disposed as a multi-layered structure, so that a stress formed in the first source 103a and the first drain 103b are dispersed to different film layers. In addition, the first stress releasing layer 104a is disposed between the first portion 103a1 and the second portion 103a2 of the first source 103a and between the first portion 103a1 and the second portion 103a2 of the first drain 103b. The stress formed in the first source 103a and the first drain 103b can also be dispersed onto the first stress releasing layer 104a, thereby improving the risk of fracture of the first source 103a and the first drain 103b caused when the bending region BA is bent, and thereby improving a defect of the fracture of the conductive structure caused when the bending region BA of the display panel 100 is bent. The first portion 103a1 and the second portion 103a2 of the first source 103a or the first portion 103b1 land the second portion 103b2 of the first drain 103b are electrically connected through at least one of the contact holes cnt, to prevent display deterioration of the display panel due to the poor contact in a wiring in any one of the contact holes cnt.

In some embodiments, the second conductive structure 102 further includes a fourth plate C21, and the first conductive structure 103 further includes a fifth plate C22. The fourth plate C21 and fifth plate C22 constitute a second storage capacitor C2. The second storage capacitor C2 corresponds to the flat display region AA. The fifth plate C22 is disposed on the interlayer dielectric layer 106c. An orthographic projection of the fourth plate C21 on the substrate 101 covers an orthographic projection of the fifth plate C22 on the substrate 101.

Alternatively, in some embodiments, the second storage capacitor C2 further includes a sixth plate C23. The sixth plate C23 is disposed in the same layer as the second semiconductor layer 107b. The orthographic projection of the fourth plate C21 on the substrate 101 covers an orthographic projection of the sixth plate C23 on the substrate 101. The fifth plate C22 and the fourth plate C21 are electrically connected. In an embodiment of the present disclosure, the second storage capacitor C2 is provided as a sandwich structure, that is, the fourth and sixth plates C21 and C23 can be regarded as a storage capacitor, and the fifth and sixth plates C22 and C23 can be regarded as another storage capacitor. The two storage capacitors are connected in parallel, which increases the charge storage capacity of the capacitor. Further, since the sixth plate C23 is disposed in the same layer as the second semiconductor layer 107b, the sixth plate C23 can be formed in a same process as the second semiconductor layer 107b. Therefore, there is no need to additionally add a photomask, and the manufacturing process of the display panel 100 is simplified. It should be understood that the sixth plate C23 is formed by conducting a semiconductor material.

In some embodiments, the second conductive structure 102 further includes a third metal wiring 102d. The first conductive structure 103 further includes a fourth metal wiring 103f. The third metal wiring 102d and the fourth metal wiring 103f are electrically connected. In an embodiment of the present disclosure, the third and fourth metal wirings 102d and 103f may constitute a same power supply wiring, which may be a high-voltage power supply wiring, a low-voltage power supply wiring, or another conductive line segment or the like. In an embodiment of the present disclosure, the third metal wiring 102d and the fourth metal wiring 103f may constitute a same power supply wiring, which are electrically connected through via holes, and the stress formed in the metal wirings may be dispersed to different film layers, thereby preventing the risk of short circuit due to excessive routing of the wirings in the same layer.

In some embodiments, the display panel 100 further includes a passivation layer 108, a planarization layer 109, an anode 110, a pixel definition layer 111, a light emitting layer 112, and a cathode 113. The passivation layer 108 covers the interlayer dielectric layer 106c and the first conductive structure 103, and a Young's modulus of is the passivation layer 108 is greater than the Young's modulus of the first stress releasing layer 104a. The planarization layer 109 is disposed on a surface of the passivation layer 108 away from the interlayer dielectric layer 106c. The anode 110 is disposed on a surface of the planarization layer 109 away from the passivation layer 108, and the anode 110 is electrically connected to the first conductive structure 103. The pixel definition layer 111 is disposed on a surface of the anode 110 away from the planarization layer 109. The pixel definition layer includes a first pixel definition layer 111a and a second pixel definition layer 111b. The pixel definition layer 111 includes an opening that exposes a portion of the anode 110. The light emitting layer 112 is limited to within the opening. The cathode 113 covers the light emitting layer 112 and the pixel definition layer 111. A material of the pixel definition layer 111 is selected from one or more of polyimide (PI), polyethylene naphthalate (Polyethylene naphthalate two formic acid glycol ester, PEN), polyethylene terephthalate (polyethylene glycol terephthalate, PET), polycarbonate (PC), polyetherimide (PEI), and polyether sulfone (PES).

In sum, although the present disclosure has been disclosed in the above preferred embodiments, the above preferred embodiments are not intended to limit the present disclosure. Those skilled in the art may make various changes and modifications without departing from the spirit and scope of the present disclosure. Therefore, the scope of the present disclosure is subject to the scope defined in the claims.

What is claimed is:

1. A display panel, the display panel having a bending region and the display panel comprising:
    a substrate;
    a first semiconductor layer disposed above substrate in a vertical direction perpendicular to an upper surface of the substrate and disposed in the bending region;
    a first gate disposed above the first semiconductor layer in the vertical direction and disposed in the bending region;
    a first stress releasing layer disposed above the first gate in the vertical direction and disposed in the bending region, wherein the first stress releasing layer comprises a plurality of first stress releasing blocks disposed apart from each other; and
    a conductive structure disposed above the first stress releasing layer in the vertical direction and disposed in the bending region, wherein a Young's modulus of the conductive structure is greater than a Young's modulus of the first stress releasing layer, the conductive structure comprises a first source and a first drain, an orthographic projection of each of the first stress releasing blocks on the substrate is entirely located within an orthographic projection of each of the first source and first drain on the substrate, and each of the first source and first drain covers an upper surface and opposite side surfaces of one of the first stress releasing blocks beneath the each of the first source and first drain,
    wherein the first source and the first drain are electrically connected to the first semiconductor layer, respectively.

2. The display panel according to claim 1, wherein the conductive structure comprises a first conductive structure, the first conductive structure is a single layer structure, and the first conductive structure is disposed on at least one surface of the first stress releasing layer.

3. The display panel according to claim 2, further comprising:
    a buffer layer disposed on the substrate;
    the first semiconductor layer disposed on a surface of the buffer layer away from the substrate;
    a gate insulating layer disposed on a surface of the first semiconductor layer away from the buffer layer;
    the first gate disposed on a surface of the gate insulating layer away from the first semiconductor layer; and
    an interlayer dielectric layer covering the first gate, the first semiconductor layer and the buffer layer, wherein the first stress releasing layer is disposed on a surface of the interlayer dielectric layer away from the first gate, and the first conductive structure is disposed on a surface of the first stress releasing layer away from the interlayer dielectric layer, and wherein a Young's modulus of the interlayer dielectric layer is greater than the Young's modulus of the first stress releasing layer.

4. The display panel according to claim 3, wherein the first conductive structure is further disposed between the first stress releasing layer and the interlayer dielectric layer in the vertical direction.

5. The display panel according to claim 3,
    wherein the interlayer dielectric layer includes a first via hole and a second via hole each penetrating through the interlayer dielectric layer, and the first source and the first drain are electrically connected to the first semiconductor layer through the first via hole and the second via hole, respectively.

6. The display panel according to claim 5, wherein the conductive structure further comprises a second conductive structure disposed on the substrate, wherein the second conductive structure comprises a first light shielding layer located in the bending region; and
    wherein the interlayer dielectric layer further includes a third via hole penetrating through the interlayer dielectric layer and the buffer layer, and the first drain is electrically connected to the first light shielding layer through the third via hole.

7. The display panel according to claim 6, wherein the second conductive structure further comprises a first plate, the first conductive structure further comprises a second plate, the first plate and the second plate constitute a first storage capacitor, the first storage capacitor is located in the bending region, the second plate is disposed on the surface of the first stress releasing layer away from the interlayer dielectric layer, and an orthographic projection of the first plate on the substrate covers an orthographic projection of the second plate on the substrate.

8. The display panel according to claim 7, wherein the first storage capacitor further comprises a third plate disposed in a same layer as the first semiconductor layer, and the orthographic projection of the first plate on the substrate covers an orthographic projection of the third plate on the substrate; and
    wherein the second plate and the first plate are electrically connected.

9. The display panel according to claim 6, further comprising a second stress releasing layer disposed between the second conductive structure and the substrate in the vertical direction, wherein a Young's modulus of the second stress releasing layer is less than a Young's modulus of the second conductive structure and a Young's modulus of the substrate.

10. The display panel according to claim 9, wherein the second stress releasing layer comprises a second stress releasing block disposed corresponding to the first light shielding layer.

11. The display panel according to claim 6, wherein the second conductive structure further comprises a first metal wiring, the first conductive structure further comprises a second metal wiring, the first metal wiring and the second metal wiring are electrically connected, and the first metal wiring and the second metal wiring constitute a same power supply wiring.

12. The display panel according to claim 6, wherein the first conductive structure further comprises a second source and a second drain, the second conductive structure further comprises a second light shielding layer, and the display panel further comprises a flat display region located at both surfaces of the bending region, wherein the second light shielding layer, the second source and the second drain are located in the flat display region, and the second source and the second drain are disposed on the interlayer dielectric layer, and wherein the display panel further comprises:
    a second semiconductor layer disposed in a same layer as the first semiconductor layer, wherein the second source and the second drain are electrically connected to the second semiconductor layer, respectively; and
    a second gate disposed in a same layer as the first gate.

13. The display panel according to claim 12, wherein the second conductive structure further comprises a fourth plate, the first conductive structure further comprises a fifth plate, the fourth plate and the fifth plate constitute a second storage capacitor corresponding to the flat display region, and an orthographic projection of the fourth plate on the substrate covers an orthographic projection of the fifth plate on the substrate.

14. The display panel according to claim 13, wherein the second storage capacitor further comprises a sixth plate disposed in a same layer as the second semiconductor layer, the orthographic projection of the fourth plate on the substrate covers an orthographic projection of the sixth plate on the substrate, and the fifth plate and the fourth plate are electrically connected.

15. The display panel according to claim 6, further comprising:
    a passivation layer covering the interlayer dielectric layer and the first conductive structure;
    a planarization layer disposed on a surface of the passivation layer away from the interlayer dielectric layer;
    an anode disposed on a surface of the planarization layer away from the passivation layer and electrically connected to the first conductive structure;
    a pixel definition layer disposed on a surface of the anode away from the planarization layer, the pixel definition layer comprising an opening that exposes a portion of the anode;
    a light emitting layer limited to within the opening; and
    a cathode covering the light emitting layer and the pixel definition layer.

16. The display panel according to claim 3, wherein the first stress releasing layer further covers at least one surface of the first conductive structure.

17. The display panel according to claim 1, wherein the conductive structure comprises a first conductive structure, the first conductive structure comprises a first conductive layer and a second conductive layer, the first conductive layer is disposed between the first stress releasing layer and the first gate in the vertical direction, the second conductive layer is disposed on a surface of the first stress releasing layer away from the substrate, the first stress releasing layer comprises a plurality of contact holes, and the first conductive layer and the second conductive layer are electrically connected through the contact holes.

18. The display panel according to claim 17, further comprising:
    a buffer layer disposed on the substrate;
    the first semiconductor layer disposed on a surface of the buffer layer away from the substrate;
    a gate insulating layer disposed on a surface of the first semiconductor layer away from the buffer layer;
    the first gate disposed on a surface of the gate insulating layer away from the first semiconductor layer; and
    an interlayer dielectric layer covering the first gate, the first semiconductor layer and the buffer layer, wherein the first stress releasing layer is disposed on a surface of the interlayer dielectric layer away from the first gate, the first conductive layer is disposed between the first stress releasing layer and the interlayer dielectric layer in the vertical direction, and the second conductive layer is disposed on a surface of the first stress releasing layer away from the interlayer dielectric layer, and wherein a Young's modulus of the interlayer dielectric layer is greater than the Young's modulus of the first stress releasing layer.

19. The display panel according to claim 18, wherein the first conductive layer comprises a first portion of the first source and a first portion of the first drain, the second conductive layer comprises a second portion of the first source and a second portion of the first drain, the first portion of the first source and the second portion of the first source are electrically connected through at least one of the contact holes, and the first portion of the first drain and the second portion of the first drain are electrically connected through at least one of the contact holes; and wherein the interlayer dielectric layer comprises a first via hole and a second via hole each penetrating through the interlayer dielectric layer, and the first portion of the first source and the first portion of the first drain are electrically connected to the first semiconductor layer through the first via hole and the second via hole, respectively.

20. The display panel according to claim 1, wherein a cross-sectional shape of each of the first stress releasing blocks comprises at least one of a trapezoidal shape, a rectangular shape, a square shape, a circle shape, a rhombic shape, a triangle shape, or an irregularly-shaped hole.

* * * * *